United States Patent [19]

Hansen et al.

[11] 4,229,233

[45] Oct. 21, 1980

[54] METHOD FOR FABRICATING NON-REFLECTIVE SEMICONDUCTOR SURFACES BY ANISOTROPIC REACTIVE ION ETCHING

[75] Inventors: Thomas A. Hansen, Poughkeepsie; Claude Johnson, Jr., Yorktown Heights; Robert R. Wilbarg, Hopewell Junction, all of N.Y.

[73] Assignee: International Business Machines Corporation, Armonk, N.Y.

[21] Appl. No.: 9,005

[22] Filed: Feb. 5, 1979

[51] Int. Cl.³ .................. H01L 21/22; H01L 21/306
[52] U.S. Cl. .................................. 148/1.5; 136/261; 148/187; 156/643; 156/646; 156/647; 156/662; 204/192 E
[58] Field of Search ............... 156/643, 646, 657, 662; 252/79.1; 136/89 CC; 204/192 E; 148/1.5, 187

[56] References Cited

U.S. PATENT DOCUMENTS

| | | | |
|---|---|---|---|
| 3,615,956 | 10/1971 | Irving et al. | 156/643 |
| 3,971,684 | 7/1976 | Muto | 156/643 |
| 4,029,518 | 6/1977 | Matsutani et al. | 136/89 CC |
| 4,094,732 | 6/1978 | Reinberg | 156/643 |
| 4,101,351 | 7/1978 | Shah et al. | 136/89 CC |
| 4,104,086 | 8/1978 | Bondur et al. | 204/192 E |

OTHER PUBLICATIONS

Hudson, "Ion Beam Texturing", *J. Vac. Sci. Technology,* vol. 14, No. 1, Jan./Feb. 1977, pp. 286–289.
Berg et al., "Surface . . . Etching", *J. Vac. Sci. Technology,* vol. 13, No. 1, Jan./Feb. 1976, pp. 403–405.
Hovel, *Semiconductors and Semimetals, vol. II, Solar Cells,* Academic Press, N.Y., pp. 225–230, (1975).
Schiable et al., "Reactive Ion . . . Silicon", *IBM Technical Disclosure Bull.,* vol. 21, No. 7, Dec. 1978, pp. 2814–2815.
Logan et al., "Method . . . Devices", *IBM Technical Disclosure Bull.,* vol. 21, No. 4, (Sep. 1978), pp. 1466–1467.

*Primary Examiner*—Jerome W. Massie
*Attorney, Agent, or Firm*—David M. Bunnell; Thomas F. Galvin

[57] ABSTRACT

A differential reactive ion etching process significantly reduces the reflectivity of silicon. The process takes place in a reactive ion etching tool, typically a diode-configured system employing ambient gases which react with the silicon.

6 Claims, 6 Drawing Figures

METHOD FOR FABRICATING NON-REFLECTIVE SEMICONDUCTOR SURFACES BY ANISOTROPIC REACTIVE ION ETCHING

BACKGROUND OF THE INVENTION

1. Field of the Invention

The present invention relates generally to techniques for etching the surfaces of semiconductor substrates, primarily silicon. In particular, the present invention relates to the fabrication of nonreflective silicon solar cells.

2. Description of the Prior Art

The direct conversion of sunlight into electrical power promises to provide energy which is both abundant and inexpensive. Among the leading techniques for achieving the conversion is the use of photovoltaic power systems which use semiconductor solar cells. The success of such systems depends on the availability of solar cells which are economical and efficient. Significant advantages have been made recently although the cost relative to fossil fuels is still prohibitively high.

The standard materials for semiconductor solar cells are silicon and cadmium sulfide, although a number of other materials, such as gallium arsenide, indium phosphide, amorphous silicon and other materials or combinations thereby, may be useful. Because silicon is the most highly-developed semiconductor technology, it is the most promising material for solar cells. It will be necessary to substantially increase the efficiency of the materials in converting sunlight into electrical energy. The principal efforts for reducing the cost of current silicon designs include automation of device processing, reducing the cost of materials and development of low-cost materials such as polycrystalline and metallurgical silicon.

Another avenue for achieving economy is to reduce the reflectivity of the silicon surface. The principal techniques for doing so involve depositing a non-reflective coating atop the silicon surface or to create a textured upper surface which collects a large percentage of reflected light and minimizes the distance which photogenerated carriers must diffuse before collection. Such non-reflective structures may yield efficiencies as high as 20 percent for monocrystalline silicon, although conversion efficiencies in production quantities are usually around 12 percent or so.

Possibly the best known of the silicon solar cells produced with a serrated or textured surface is the COMSAT non-reflecting (CNR) cell. In the CNR cell, pyramidal surfaces are produced on <100> oriented wafers by preferential etching techniques, one of which is a hydrazine-hydrate etch. The cell achieves reduced reflectivity, less dependency on antireflection coatings and increased collection efficiency due to carrier generation closer to the junction. The reflectivity of bare silicon is reduced from 35 to 45 percent for flat surfaces to around 20 percent for the textured surface, and the addition of an antireflection coating reduces the overall reflection to a few percent. The CNR cell has been described in greater detail in the text by Harold J. Hovel entitled "Semiconductors and Semimetals", Vol. 2, *Solar cells*, Academic Press, 1975, pp. 225-227.

As noted, the production of the CNR cells involves wet etching. As is well known in semiconductor art generally, wet etching is at times difficult to control, particularly because of contaminants which may be contained in the etching fluid or the precise duration of the etching step needed to produce acceptable results. Another problem with the wet etching process to produce the textured surfaces is that it is effective only on single crystalline silicon. This is the most expensive type of silicon; and it would be desirable to produce textured surfaces on so-called "solar grade" silicon, which is considerably cheaper and adaptable to mass production.

Another well-known technique for etching silicon involves dry RF plasma etching using halocarbon mixtures. Other dry etching techniques involve physical sputtering such as DC or RF sputter etching and ion milling procedures.

Plasma etching involves the chemical combination of the surface of the material to be etched with a gaseous species produced in a discharge. It is distinct from physical sputtering which involves ion bombardment only.

Such techniques have been used not only to etch silicon and other materials but have also been used to clean their surfaces of contaminants and also to remove materials, such as silicon dioxide, and photoresist from its surface. We have found, however, that neither sputter etching, ion milling, nor plasma etching techniques will yield a non-reflective cell having the characteristics of the CNR cell. In particular, a plasma tool where the RF power is coupled outside the chamber is not effective; the silicon is merely etched.

SUMMARY OF THE INVENTION

It is, therefore, a principal object of our invention to fabricate textured surfaces of semiconductors using dry etching techniques.

It is another object of our invention to increase the collection efficiency of silicon solar cells via a reduction in their light reflectivity by dry etching techniques.

It is yet another object of our invention to create such surfaces on both single crystalline silicon material as well as solar grade silicon material and amorphous silicon.

It is yet another object of our invention to create such textured surfaces using commercially available equipment so that such cells may be produced economically in a manufacturing environment.

These and other objects of our invention are achieved by subjecting the semiconductor to reactive ion etching process. By the term "reactive ion etching" we mean that the surface of the silicon is subjected to both physical sputtering as well as a chemical reaction with the gaseous species. One or the other alone will not suffice. In particular, a chamber which is diode-configured or similar equipment is required so that the ions are accelerated.

Using this technique, a textured surface which appears black and is velvet to the naked eye is produced. Using scanning electron micrography, it can be seen that the surface of the silicon is pyramidal in nature, quite similar to the CNR cell. Other useful surface configurations are achievable using various ambient gases.

When used on single crystalline silicon substrates, our technique results in an 80 to 90 percent reduction in reflectivity from the polished silicon surface. When using solar grade silicon, such as is available with ribbon silicon processes, our technique results in a 30 to 40 percent increase in efficiency, that is from 8.2 percent to 11 percent. In fact, ours is the only technique known to us which has successfully produced textured surfaces on the ribbon silicon.

Our technique may be used without any mask on the silicon surface, although it may be desirable to provide masking to achieve particular types of structures.

Another feature of our invention is that the reactive ion etching may be done either prior to or following the formation of the P-N junction in the silicon. In addition, anti-reflective coatings may be added after the process is completed to further enhance the efficiency of the cell.

BRIEF DESCRIPTION OF THE DRAWING

Our invention and its objects and features may be more clearly understood from the following detailed description taken in conjunction with the drawing.

FIG. 1 illustrates a silicon solar cell produced with a serrated surface. The serrations are in the form of pyramids which yields benefits of reduced reflectivity and increased collection efficiency due to carrier generation closer to the junction 2. As previously mentioned, this type of cell is commonly called the CNR cell and has been produced previously using a preferential wet etching technique. The cell is shown in schematic form and is idealized for illustrative purposes. Our process has achieved configurations similar to the idealized version, with variations being due to the particular reactive gas which we use.

The cell basically comprises a body of silicon 3 which is typically P type after the etching is completed an N type doping, preferably by diffusion of arsenic, is done into the upper surface of the silicon to produce junction 2. A contact plate 6 is shown at the lower surface and, for an operative cell, it would be necessary to also place contacts at selected locations on the upper surface of the cell. This type of arrangement is well known to those of skill in the art, and the upper contacts are not shown.

The increased collection efficiency is a result of the reflection of the light entering the silicon. To further reduce the overall reflection, an anti-reflection coating of well-known characteristics may also be applied to the upper surface of the wafer.

Figure 1:
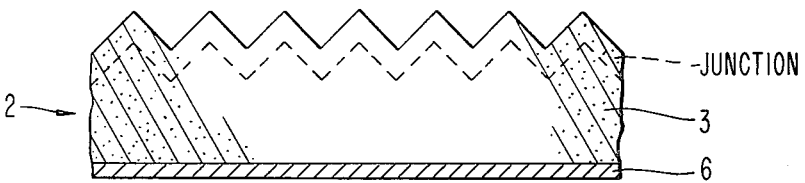
FIG. 1 is a schematic view in section of a silicon semiconductor body having a textured surface layer which is formed by our invention.
Figure 2:
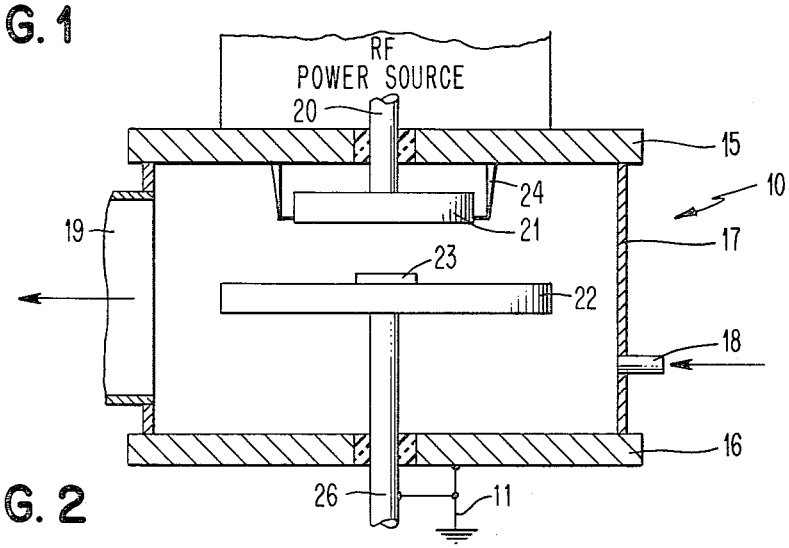
FIG. 2 is a schematic view depicting planar diode etching apparatus which is useful for the plasma etching method of our invention.
Figure 3:
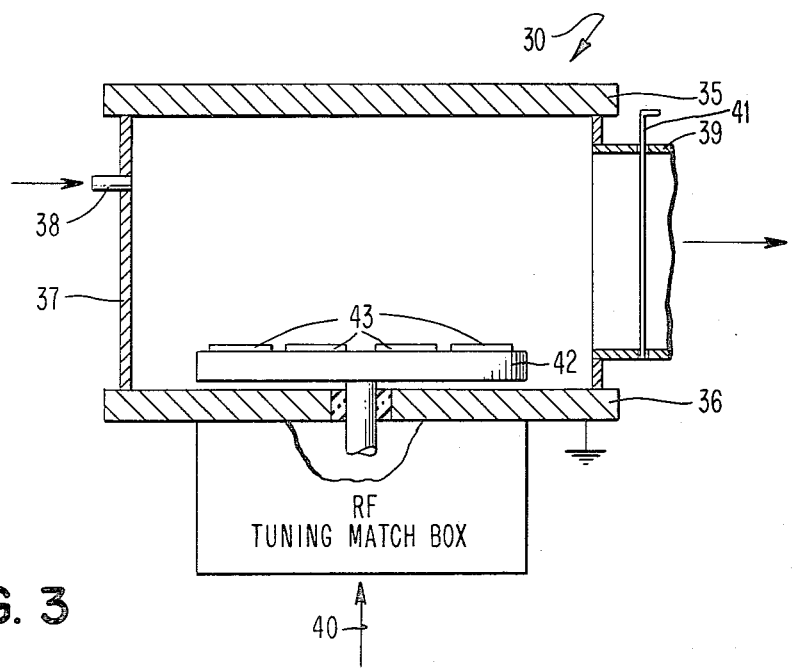
FIG. 3 is a schematic view depicting diode-configured etching apparatus which is also used to practice our invention.

We have produced cells of this type using the reactive ion etching processes outlined briefly above. As previously discussed, we have found that it is necessary to bombard the silicon with the reactive ions to achieve our novel results. At the present time, this can be achieved only in plasma chambers which are capable of causing this bombardment of the reactive gas on the silicon surface. These systems are generally known as diode-configured chambers, and two such systems are illustrated in FIGS. 2 and 3. Other systems which are capable of causing bombardment of silicon by reactive gases are alone expected to be effective, and it is not our intention to limit our invention to the systems illustrated herein. For example, triode systems would also be effective.

FIG. 2 is a planar diode-type plasma reactor which includes a low pressure gas ionization chamber 10 which is connected to a source of shielded RF power and to ground 11. Chamber 10 includes a metallic chamber wall 17 which is mounted between a pair of metallic base plates 15 and 16. Chamber 10 is typically made of aluminum or stainless steel with an aluminum liner. A suitable plasma etching gas is introduced into the chamber through gas inlet 18 and exits from the chamber by means of a high vacuum pump (not shown) through port 19. Within the chamber are positioned an anode 22 which is typically stainless steel. Anode 22 is connected to the ground potential 11 via tube 26 which also supplies cooling fluid to the anode. Disposed on the surface of anode plate 22 is a silicon wafer 23 which is to be textured in accordance with our invention.

Disposed in proximate relationship with anode 22 is a cathode plate 21. Typically, plate 21 comprises quartz which is bonded to a copper cathode. A stainless steel shield 24 surrounds cathode 21 and serves to suppress any glow discharge which otherwise might take place behind the cathode. In our system the cathode plate is $7\frac{1}{2}''$ in diameter, the anode is 10'' in diameter and the spacing between them is $3\frac{3}{8}''$.

An RF power source 25 is connected to the system by means of tube 20, which also supplies cooling fluid to the cathode.

A system of this type is available from the Applied Materials Corporation and is known as their Plasma I model.

FIG. 3 is a diode-configured system which uses a sputtering configuration so that there is considerable ion bombardment on the wafers. When a reactive gas, such as $CF_4$ is mixed with $O_2$, is used in this system and subjected to a glow discharge, preferential etching, i.e., texturing of the silicon surfaces occurs. In this system the entire chamber 30 acts as the anode, and silicon wafers 43 are placed on a cathode 42 which is connected to an RF power source 40 through a matchbox.

The system includes as inlet port 38 in wall 37 for gas entry and outlet port 39 with a throttle valve 41 which controls gas flow.

Both of the systems illustrated in FIGS. 2 and 3 use a 13.56 megahertz RF power signal due to FCC regulations. However, they are effective with other frequencies.

As previously noted, we have been unsuccessful in obtaining useful anti-reflective surface on silicon when using systems which are not capable of providing both considerable ion bombardment of the wafers, as well as creating chemically active species which combine with the silicon to be etched to form a volatile species. One example of apparatus which has not been effective is the type illustrated in U.S. Pat. No. 3,867,216, which is similar to one marketed by the LFE Corporation and known commercially as the "LFE plasma tool". This type of apparatus is incapable of accelerating the reactive ions sufficiently and merely etches the silicon surface. In practice, some small areas on a wafer which are textured are formed but the process is neither uniform nor consistent.

EXAMPLES

Figure 4C:
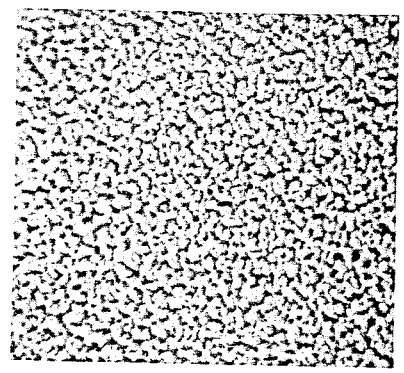
FIGS. 4A, 4B and 4C are scanning electron micrographs of textured silicon surfaces formed in accordance with our invention and using different ambient gases.
Figure 4B:
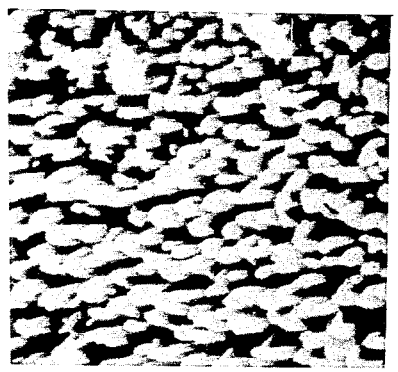
Figure 4A:
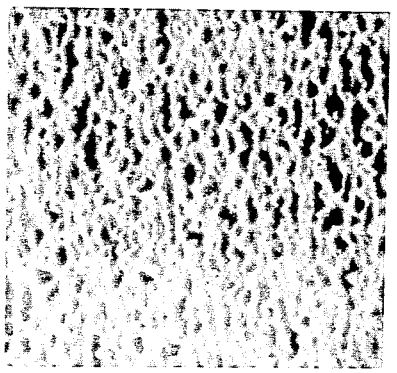

In one embodiment of our process we used the diode-configured system illustrated in FIG. 3 with a mixture of $Cl_2$, Ar and $O_2$ in one experiment and a mixture of $Cl_2$ and Ar in another at flow rates of around 20–30cc per minute. The results were good. The micrograph in FIG. 4A illustrates a silicon surface which was textured using the $Cl_2$, Ar and $0_2$ mixture. The surface appears blue under white light, indicating that it is an efficient absorber of IR radiation.

In another embodiment of our process we employed the diode-configured system illustrated in FIG. 2 with a chlorine-argon gas, employing around 10 percent chlorine-90 percent argon, at a flow rate of around 10cc per minute to create a multiplicity of stalactite-type structures on the surface of a silicon wafer with "fingers" of silicon-silicon $X$, which were approximately 15,000Å high and 3,000Å wide with spacings therebetween of around 3,000 to 5,000Å. The micrograph of this surface is illustrated in FIG. 4B.

Gases as $CCl_4$ or $CF_4$ and other halocarbon-based gases mixed with an inert gas such as Ar and He are also expected to be effective in this type of system for texturing silicon.

In another process we utilized the system illustrated in FIG. 2 with a mixture of $SF_6$ and $H_2$ with a flow rate of 8cc and 2cc per minute, respectively. The RF power supplied to the system was around 200 watts; the pressure during the texturing process within the chamber was around 90 microns, and the duration of the etching process was around 10 minutes. The result was an excellent uniform blackened silicon surface which appeared to be totally nonreflective. The micrograph of this surface is illustrated in FIG. 4C.

In another process we used $SF_6$ alone with the same power and pressure and flow rate of 10cc per minute for between 5 and 10 minutes. The result was partial blackening akin to dulling of the silicon surface, a result which is considered to be less desirable than the former process using $SF_6$—$H_2$.

To obtain an improved silicon surface having a more uniform P/N Junction in the silicon, a non-erodable metal mask, such as chrome, may be used during the texturing process. The mask is fabricated with an array of pinholes of suitable dimension, such as 2μm in diameter and 2μm apart. After texturing by our reactive ion etching process, using any of the previously named gases, the serrations on the silicon surface are more nearly conical than pyramidal. However, when the P/N junction is subsequently formed in the silicon as by diffusion, the contours of the junction more nearly follow the surface contours.

While our invention has been particularly shown and described with reference to the preferred embodiments thereof, it will be understood by those skilled in the art that various changes in form and details may be made therein without departing from the spirit and scope of the invention.

We claim:

1. A method for texturing a silicon substrate to provide an anti-reflective surface thereon comprising the step of:

reactive ion etching the surface of said substrate, in the absence of an etch mask on said surface, in a reactive ion etching chamber which contains a chemically active gaseous species which combines with said silicon to form a volatile species such that said surface is subjected to both physical sputtering as well as a chemical reaction with the gaseous species, said etching taking place for a sufficient time to texture said silicon surface.

2. A method as in claim 1 wherein said gaseous species is a mixture of $SF_6$ and $H_2$.

3. A method as in claim 1 wherein said gaseous species is a mixture of $Cl_2$, Ar and $O_2$.

4. A method as in claim 1 wherein said gaseous species is $Cl_2$ and Ar.

5. A method as in claim 1 wherein said gaseous species includes a halocarbon gas capable of reacting with silicon to form a volatile species.

6. A method as in claim 1 further comprising:

forming a P/N junction with in said substrate after said texturing step.

* * * * *